United States Patent
Peng et al.

(10) Patent No.: US 8,481,353 B2
(45) Date of Patent: Jul. 9, 2013

(54) METHOD OF SEPARATING NITRIDE FILMS FROM THE GROWTH SUBSTRATES BY SELECTIVE PHOTO-ENHANCED WET OXIDATION

(75) Inventors: Lung-Han Peng, Hsinchu (TW); Jeng-Wei Yu, Hsinchu (TW); Po-Chun Yeh, Hsinchu (TW)

(73) Assignee: Opto Tech Corporation, Hsinchu (TW)

(*) Notice: Subject to any disclaimer, the term of this patent is extended or adjusted under 35 U.S.C. 154(b) by 82 days.

(21) Appl. No.: 13/086,787

(22) Filed: Apr. 14, 2011

(65) Prior Publication Data

US 2012/0264247 A1 Oct. 18, 2012

(51) Int. Cl.
H01L 21/00 (2006.01)

(52) U.S. Cl.
USPC ............ 438/46; 438/38; 438/458; 438/481; 257/E21.232; 257/E33.025

(58) Field of Classification Search
USPC .................. 438/22, 26, 46; 257/79, 98, 615, 257/E21.09, E29.089, E33.001, E33.023, 257/E33.025, E33.057, E33.058, E33.062
See application file for complete search history.

(56) References Cited

U.S. PATENT DOCUMENTS

| | | | |
|---|---|---|---|
| 2008/0258161 A1* | 10/2008 | Edmond et al. | 257/98 |
| 2010/0264446 A1 | 10/2010 | Niki et al. | |
| 2011/0095317 A1* | 4/2011 | Kim | 257/98 |
| 2011/0175112 A1* | 7/2011 | David et al. | 257/79 |
| 2011/0186863 A1* | 8/2011 | Lee et al. | 257/79 |

OTHER PUBLICATIONS

Peng et al. [Photo enhanced wet oxidation of gallium nitride]; Jan. 24, 2000.*
Lee et al. [Investigation of a Metal-Insulator-Semiconductor Pt/Mixed Al2O3 and Ga2O3 Insulator/AlGaN Hydrogen Sensor]; Jun. 8, 2010.*
Cho et al, "Green Light Emitting Diodes on Semipolar {1122} Microfacets Grown by Selective Area Epitaxy", Journal of the Electrochmical, vol. 157, Jan. 2010, 4 pgs.
Feng et al, "Green Light Emission from InGaN Multiple Quantum Wells Grown on GaN Pyramidal Stripes Using Selective Area Epitaxy", Journal of Applied Physics, vol. 104, Nov. 2008, 4 pgs.

* cited by examiner

*Primary Examiner* — Charles Garber
*Assistant Examiner* — Abdulfattah Mustapha
(74) *Attorney, Agent, or Firm* — WPAT, PC; Justin King

(57) ABSTRACT

Various embodiments of the present disclosure pertain to separating nitride films from growth substrates by selective photo-enhanced wet oxidation. In one aspect, a method may transform a portion of a III-nitride structure that bonds with a first substrate structure into a III-oxide layer by selective photo-enhanced wet oxidation. The method may further separate the first substrate structure from the III-nitride structure.

13 Claims, 5 Drawing Sheets

METHOD OF SEPARATING NITRIDE FILMS FROM THE GROWTH SUBSTRATES BY SELECTIVE PHOTO-ENHANCED WET OXIDATION

BACKGROUND

1. Technical Field

Various embodiments of the present disclosure relate to semiconductor light-emitting devices and, more particularly, to a method of separating nitride films from grow substrates by selective photo-enhanced wet oxidation.

2. Description of the Relevant Art

For high power blue light-emitting diodes (LEDs), III-nitride such as GaN (gallium nitride) or InGaN (indium gallium nitride) semiconductor material is typically grown on a sapphire substrate. For instance, a thin GaN film of a few microns thick is grown on a sapphire substrate. Major costs of LED fabrication are the sapphire substrate and the scribe-and-break operation. For the traditional LED configuration the sapphire is not removed. A vertical LED structure, however, requires removing the sapphire before attaching electrical contacts on the active epitaxy (epi) layer. Excimer lasers are typically utilized for separating the sapphire and GaN thin film in a technique known as laser lift-off.

Laser lift-off is a technique for detaching a sapphire substrate from III-nitride epi layers as used in the LED industry. Excimer lasers at 248 and 193 nm excel in this application as they provide large (several mm wide) spots on target with homogeneity better than +/−5%. The laser light goes through the back of a sapphire wafer causing photo-induced decomposition at the GaN/sapphire interface, and creates a localized explosive shock wave that debonds the interface. This technique can be used for wafer based LEDs as well as flip chips.

LED laser lift-off reduces the time and cost of the LED fabrication process, enabling the manufacturer to grow GaN LED film devices on the sapphire wafer, for example, prior to transfer the thin film device to a heat sink electrical interconnect. This process allows for the creation of free standing GaN films, and the integration of GaN LEDs onto virtually any carrier substrate.

However, as laser lift-off causes decomposition at the III-nitride epi layer/sapphire interface by way of a localized explosive shock wave that debonds the interface, quality of the III-nitride epi layer is inevitably impacted, degraded or otherwise compromised as a result of laser lift-off. In addition, laser lift-off tends to have issues such as yield rate, high costs of equipment, and environmental impact as a result of the use of high energy.

Techniques for separating the sapphire substrate from the III-nitride epi layer other than laser lift-off also exist, such wet etch and other techniques. Among these techniques, a technique for separating SiO/GaN nanocolumns and GaN film requires the use of HF to etch SiO nanocolumns to result in stress release. More specifically, GaN nanocolumns in epitaxial regrowth region are broken to allow separation of the GaN film and the substrate. At least in terms of industrial pollution and environmental protection, none of the aforementioned techniques is optimal.

SUMMARY

Various embodiments of the present disclosure pertain to separating nitride films from growth substrates by selective photo-enhanced wet oxidation.

In one aspect, a method may comprise: transforming a portion of a III-nitride structure that bonds with a first substrate structure into a III-oxide layer by selective photo-enhanced wet oxidation; and separating the first substrate structure from the III-nitride structure.

In one embodiment, the first substrate structure may comprise a substrate and at least a first III-nitride layer having a first high bandgap energy on the substrate, and the III-nitride structure may comprise at least a second III-nitride layer having a first low bandgap energy that bonds with the first III-nitride layer.

The selective photo-enhanced wet oxidation may comprise photo-enhanced wet oxidation with a photonic energy between the first high bandgap energy and the first low bandgap energy.

The substrate may comprise a sapphire substrate, the first III-nitride layer may comprise a (In/Ga)N layer, the second III-nitride layer may comprise a (In/Ga)N layer, and the III-oxide layer may comprise a $(In/Ga)_2O_3$ layer.

In one embodiment, separating the first substrate structure from the III-nitride structure may comprise dissolving the III-oxide layer using an acidic electrolyte or a basic electrolyte. The acidic electrolyte may comprise $H_3PO_4$. The basic electrolyte may comprise KOH.

Additionally, the method may further comprise bonding a second substrate structure with a side of the III-nitride structure that does not bond with the first substrate structure prior to separating the first substrate structure from the III-nitride structure.

In one embodiment, a surface of the second substrate structure may comprise a metal bond layer, and bonding the second substrate structure with a side of the III-nitride structure that does not bond with the first substrate structure may comprise bonding the surface of the second substrate structure having the metal bond layer with the side of the III-nitride structure that does not bond with the first substrate structure.

In another aspect, a method may comprise: in a light-emitting diode (LED) structure having a first substrate structure and at least a III-nitride structure having a first low bandgap energy with a first side of the III-nitride structure bonded to a first III-nitride layer having a first high bandgap energy of the substrate structure, transforming a portion of the III-nitride structure that bonds to the first III-nitride layer of the first substrate structure into a III-oxide layer by selective photo-enhanced wet oxidation; bonding a second substrate structure to a second side of the III-nitride structure; and dissolving the III-oxide layer to separate the III-nitride structure and the first substrate structure.

In one embodiment, the selective photo-enhanced wet oxidation may comprise photo-enhanced wet oxidation with a photonic energy between the first high bandgap energy and the first low bandgap energy.

The first substrate structure may comprise a sapphire substrate, the first III-nitride layer having a first high bandgap energy may comprise a (In/Ga)N layer, the first side of the III-nitride structure may comprise a (In/Ga)N layer, and the III-oxide layer may comprise a $(In/Ga)_2O_3$ layer.

In one embodiment, dissolving the III-oxide layer may comprise dissolving the III-oxide layer using an acidic electrolyte or a basic electrolyte. The acidic electrolyte may comprise $H_3PO_4$. The basic electrolyte may comprise KOH.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

Various embodiments of the present disclosure pertain to separating nitride films from growth substrates by selective photo-enhanced wet oxidation.

In an LED structure having layers of III-nitride with low bandgap energy $E_{g,Lo}$ and high bandgap energy $E_{g,Hi}$, selective photo-enhanced wet oxidation with a photonic energy $h\gamma$, where $E_{g,Lo} < h\gamma < E_{g,Hi}$, can transform III-nitride compounds with $E_{g,Lo}$ into III-oxide compounds. This technique can be utilized to form a III-oxide layer between the sapphire substrate and the rest of the LED structure to facilitate separation of the substrate from the rest of the LED structure. This proposed novel technique does not compromise the quality of the III-nitride epi layer as does with laser lift-off. The proposed technique also does not cause other aforementioned issues associated with laser lift-off and other techniques such as etch with HF.

Referring to FIGS. 4-8, a photo-enhanced chemical oxidation/etching process in accordance with the present disclosure will now be introduced as embodiments of the inventive techniques of the present disclosure, to be described later, utilize one or more aspects of photo-enhanced chemical oxidation/etching.

Photo-Enhanced Chemical Oxidation (Etching)

A photo-enhanced chemical (PEC) oxidation/etching process is a kind of photochemistry process. In III-nitride materials, this process consists of applying a ultraviolet (UV) irradiation onto a galvanic cell formed by immersing a III-nitride working electrode, a platinum (Pt) counter electrode, and a reference electrode in an electrolyte. The resultant reaction is that the UV-excited hot carriers at the III-nitride/electrolyte interface have excess energy to access the $H+/H_2$ and $OH-/O_2$ redox levels in water and enhance the oxidative dissolution of III-nitride specimen.

Figure 4:
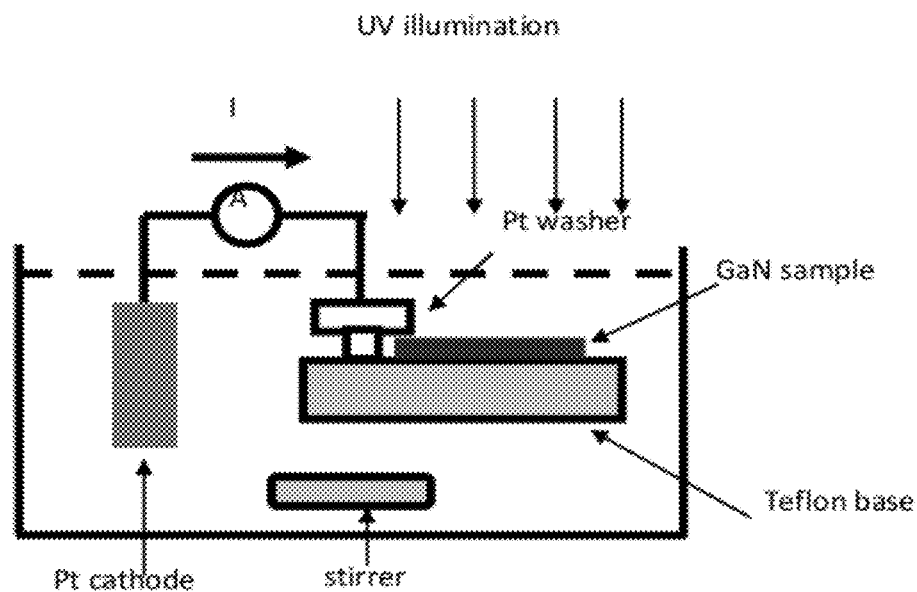
FIGS. 4-8 are diagrams relating to a photo-enhanced chemical oxidation (etching) process in accordance with the present disclosure.

FIG. 4 shows an experimental setup. One or more samples are mounted on a Teflon base and clipped by a Pt washer. The Pt wire cathode and ammeter are used to monitor the reaction current flowing in the reaction cell. A 253.7 nm mercury (Hg) line source is used to illuminate the whole sample surface with UV light of intensity of about 20 mW/cm². Ultraviolet illumination generates electron-hole pairs and enhances the oxidation and reduction reactions at the semiconductor surface. The solution can be KOH, $H_3PO_4$, etc. for etching process and $CH_3COOH/CH_3COONH_4$ buffer solution for oxidation. It has been proposed that the PEC etching of GaN occurs through oxidative decomposition, in which photo-generated holes assist in the oxidation and subsequent dissolution of the semiconductor into aqueous acid or base solution. The oxidation reaction below is responsible for the decomposition of GaN, where $e^-/h^+$ stands, separately, for photo-generated electron/hole.

Cathode: $2H_2O + 2e^- \rightarrow 2OH^- + H_2$. (1)

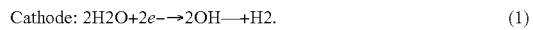

Anode: $2GaN + 6OH^- + 6h^+ \rightarrow Ga_2O_3 + N_2 + 3H_2O$. (2)

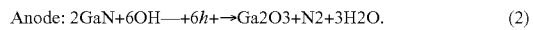

Gallium oxide formed on the interface of semiconductor and electrolyte can be removed (etching) or preserved (oxidation) depending on the solution in PEC process. The surface energy band diagrams for GaN of different doping types are shown in FIG. 5.

Figure 5:
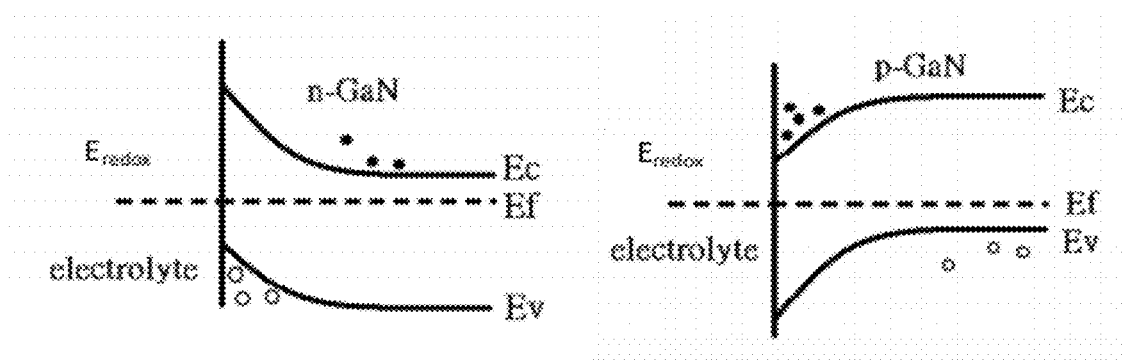

FIG. 5 illustrates the band bending of n- and p-type at the semiconductor/electrolyte interface. Upward (n-GaN) and downward (p-GaN) band bending at the surface of the GaN occurs due to the types of dopant in the GaN films. For n-type GaN, the photo-generated holes can be effectively accumulated near the semiconductor/electrolyte interface and, therefore, assists the reaction and oxidation of GaN. However, in p-type GaN the downward band bending accumulates the electrons near the interface. The electron accumulation enhances the bond strength between Ga—O and results in not only the slowing down of the dissolution rate of $Ga_2O_3$ but also inhibiting further oxidation of GaN.

Photo-Enhanced Chemical Wet Oxidation Characteristics of GaN

There have been few reports on the oxidation or etching characteristics of GaN or its related compounds from crystallographic aspects, e.g., orientation effect on etching rates, shapes of pits and hillocks, and dissolution processes. To the inventors' knowledge, there has been no report on the orientation effects of GaN wet chemical oxidation.

Figure 6:
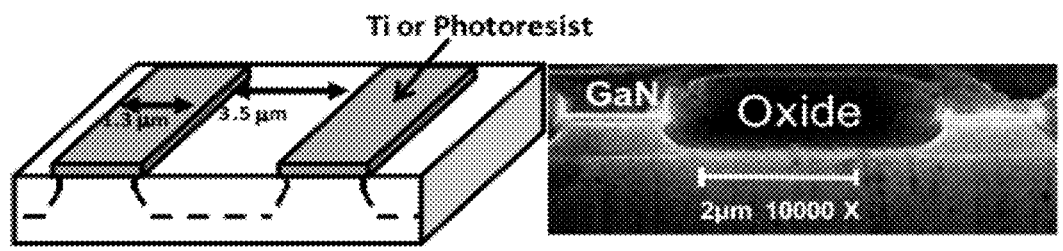

To this purpose, the inventors employed a 4 μm-thick n-type GaN epilayer grown on sapphire by metal-organic chemical vapor deposition (MOCVD). The substrate was lapped and polished to the thickness of about 90 μm to permit cleavage for the observation of etching profiles. A thin titanium metal or photoresist strip of approximately 100 nm parallel to the $[11\bar{2}0]_{GaN}$ direction was deposited on the sample by standard photolithography and lift-off techniques. The electrochemical cell is shown in FIG. 4 with Ti or photoresist contact formed on the edge of each sample to serve as PEC working electrode and Pt as counter electrode. A buffered acetic acid electrolyte ($CH_3COOH/CH_3COONH_4$) of pH value 6.4 was prepared to adjust the redox Fermi level with respect to the band-edge of GaN. FIG. 6 displays an illustrative scanning electron micrograph revealing the cleaved cross-sectional oxidation profile after PEC oxidation for 2 hours and dehydrated at 350° C. for 1 hour.

It can be observed that volume expansion occurred in the conversion of GaN to $Ga_2O_3$. Moreover, cracks on oxide indicate the release of strain inside the oxide layer. It is interesting to note that the oxidation profile reveals anisotropic reaction rate. From the underlying profile beneath oxide, the oxidation rate along $[000\bar{1}]$ is about 10 times faster than that along $[1\bar{1}00]_{GaN}$. The anisotropic property may result from the difference between both the surface energy and surface field of GaN of different crystallographic plane. In the present case, the PEC oxidation process was enhanced by the internal field along $[000\bar{1}]$ caused by surface band bending of GaN. As a result of the direction of the internal field (along c-axis), the non-polar plane of $\{1\bar{1}00\}_{GaN}$ and $\{11\bar{2}0\}_{GaN}$ are less influenced and reveal slower oxidation rate.

Figure 7:
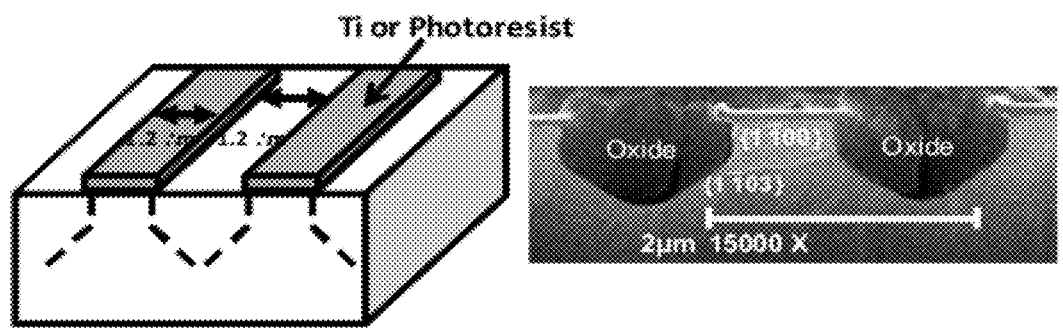

Further investigation by repeated oxidation and oxide removing by immersing in $CH_3COOH$ solution on a 4 μm-thick GaN sample was carried out with Ti strip parallel to the $[11\bar{2}0]_{GaN}$ direction. The strip was 1.2 μm in width with GaN opening of the same size. The GaN sample was first PEC oxidation for 2 hours followed by oxide removing, and successive oxidation for 2 hours was proceeded to reach a deep oxidation profile. As illustrated in FIG. 7, the resultant profile exhibited pentagon shape bounded by $\{1\bar{1}00\}_{GaN}$ and $\{1\bar{1}03\}_{GaN}$ with 60° inclined angle to the substrate normal.

With the crystallographic properties of PEC oxidation, various oxidation profiles can be easily formed for the application such as the vertical facet for laser, light emitting diodes, and microcavity fabrication.

Selective Photo-Enhanced Wet Oxidation (Etching)

Figure 8:
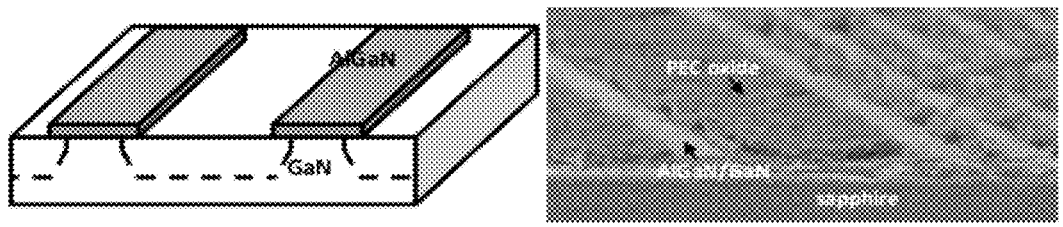

The selective photo-enhanced wet oxidation (etching) process involves triggering photo-enhanced wet oxidation with a photonic energy $h\gamma$, where $E_{g,Lo} < h\gamma < E_{g,Hi m}$, can transform III-nitride compounds with a bandgap energy of $E_{g,Lo}$ into III-oxide compounds. For example, III-nitrides such as (In/Ga)N can be transformed into III-oxide such as $(In/Ga)_2O_3$ by selective photo-enhanced wet oxidation. Consequently, the first III-nitride layer, having a low bandgap energy $E_{g,Lo}$, is transformed into a corresponding III-oxide layer, and the second III-nitride layer, having a high bandgap energy $E_{g,Hi}$, maintains the original composition. As the typical photo-enhanced wet oxidation (etching) process, III-oxide formed on the interface of semiconductor and electrolyte can be removed (etching) or preserved (oxidation) depending on the solution in this photochemistry process. FIG. 8 is the result of selective photo-enhanced wet oxidation performed on AlGaN/GaN hetero-structure with etched grooves. Selective transformation of GaN into $Ga_2O_3$ can be done, with AlGaN remaining, without any metal mask being used.

Illustrative Progression of Separating a Substrate from an LED Structure

Figure 1A:
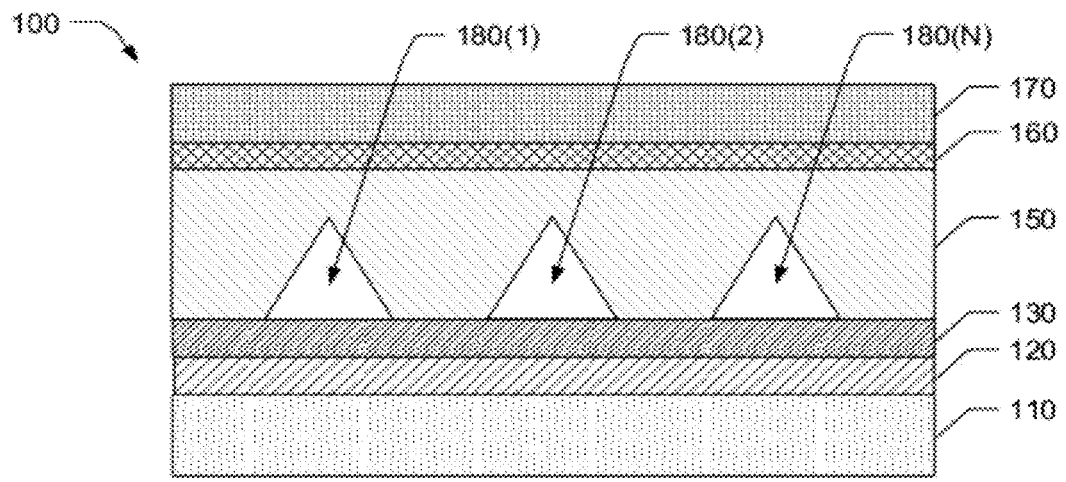
FIGS. 1A-1C are diagrams showing progression in separating nitride films from a growth substrate in accordance with an embodiment to the present disclosure.

FIG. 1A illustrates an LED structure 100. The LED structure 100 comprises a first substrate structure. The first substrate structure includes substrate 110 having a first III-nitride layer 120 deposited thereon, and a second III-nitride layer 130 deposited on the first III-nitride layer 120. In one embodiment, the substrate 110 is a sapphire substrate. In one embodiment, the substrate 110 is a C plane (0001) sapphire substrate. In other embodiments, the substrate 110 may be an A plane ($11\bar{2}0$) sapphire substrate, an R plane ($1\bar{1}02$) sapphire substrate, or an M plane ($1\bar{1}00$) sapphire substrate. The first III-nitride layer 120 and the second III-nitride layer 130 are layers of nitride compounds including those from the boron family of the Periodic Table, such as Al (aluminum), Ga (gallium), and In (indium) for example. In one embodiment, the first III-nitride layer 120 may comprise a layer of GaN, InN, AlGaN, or InGaN. In one embodiment, the second III-nitride layer 130 may comprise a layer of GaN, InN, AlGaN, or InGaN. Between the first III-nitride layer 120 and the second III-nitride layer 130, the first III-nitride layer 120 has a low bandgap energy $E_{g,Lo1}$ and the second III-nitride layer 130 has a high bandgap energy $E_{g,Hi1}$ where $E_{g,Hi1} > E_{g,Lo1}$.

The LED structure 100 further comprises a III-nitride structure that is bonded with the first substrate structure. The III-nitride structure includes a third III-nitride layer 150 and a plurality of III-nitride layers, such as a fourth III-nitride layer 160 and a fifth III-nitride layer 170 as shown in FIG. 1A for illustrative purpose only, above the third III-nitride layer 150. For example, for a GaN-based LED structure, the third III-nitride layer 150 may comprise n-GaN, the fourth III-nitride layer 160 may comprise a multiple-quantum well (MQW) emission layer, and the fifth III-nitride layer 170 may comprise p-GaN. The third III-nitride layer 150 has a low bandgap energy $E_{g,Lo2}$, where $E_{g,Lo2}$ may be the same as or different than $E_{g,Lo1}$ and less than $E_{g,Hi1}$.

The LED structure 100 has a plurality of parallel air gaps 180(1)-180(N) that are repeated in a two-dimensional pattern, where N is a positive integer greater than 1. The air gaps 180(1)-180(N) provide crystal lattice momentum for optical diffraction to advantageously result in increased external quantum efficiency similar to that achieved by the approach of having a plurality of protrusions repeated in a two-dimensional pattern on a surface of a C plane (0001) sapphire substrate. The air gaps 180(1)-180(N) also support heat dissipation from the LED structure 100 during operation.

Figure 1B:
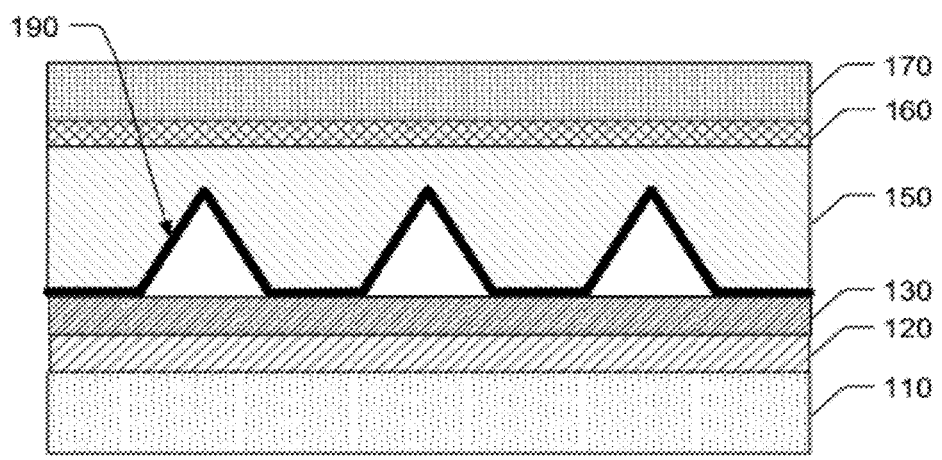

FIG. 1B illustrates the LED structure 100 after a selective photo-enhanced wet oxidation process.

The selective photo-enhanced wet oxidation involves triggering photo-enhanced wet oxidation with a photonic energy $h\gamma$, where $E_{g,Lo2} < h\gamma < E_{g,Lo1}$, from the back side of the substrate 110. More specifically, selective photo-enhanced wet oxidation with a photonic energy $h\gamma$, where $E_{g,Lo} < h\gamma < E_{g,Hi}$, can transform III-nitride compounds with a bandgap energy of $E_{g,Lo}$ into III-oxide compounds. For example, III-nitrides such as (In/Ga)N can be transformed into III-oxide such as $(In/Ga)_2O_3$ by selective photo-enhanced wet oxidation. Consequently, at least a portion of the third III-nitride 150, which has a low bandgap energy $E_{g,Lo2}$, that bonds with the first substrate structure is transformed into a corresponding III-oxide layer 190.

Figure 1C:
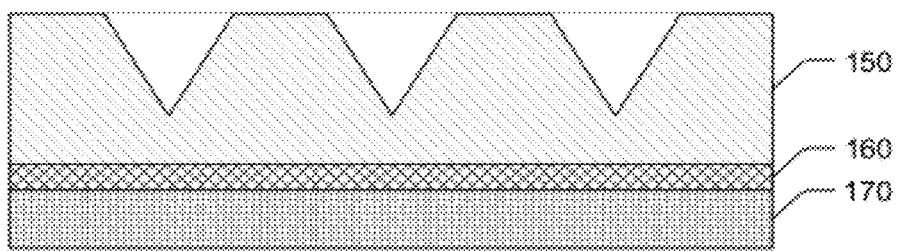

FIG. 1C illustrates the LED structure 100 after the first substrate structure and the III-nitride structure have separated from each other.

Using a known wafer bonding technique, the side of the LED structure 100 opposite the substrate 110 is bonded with a second substrate structure. The bonding surface of the second substrate may be coated with a metal bonding layer to help the bonding with the LED structure 100. After the bonding, the LED structure 100 is immersed in a weak acidic or weak basic electrolyte. Given the high solubility of $(In/Ga)_2O_3$ in a weak acidic or weak basic electrolyte, the III-oxide in the LED structure 100 is dissolved. In particular, with the III-oxide layer 190 dissolved, the first substrate structure is separated from the III-nitride structure. The result is shown in FIG. 1C.

In one embodiment, the weak acidic electrolyte is $H_3PO_4$, and the weak basic electrolyte is KOH.

Illustrative Processes

Figure 2:
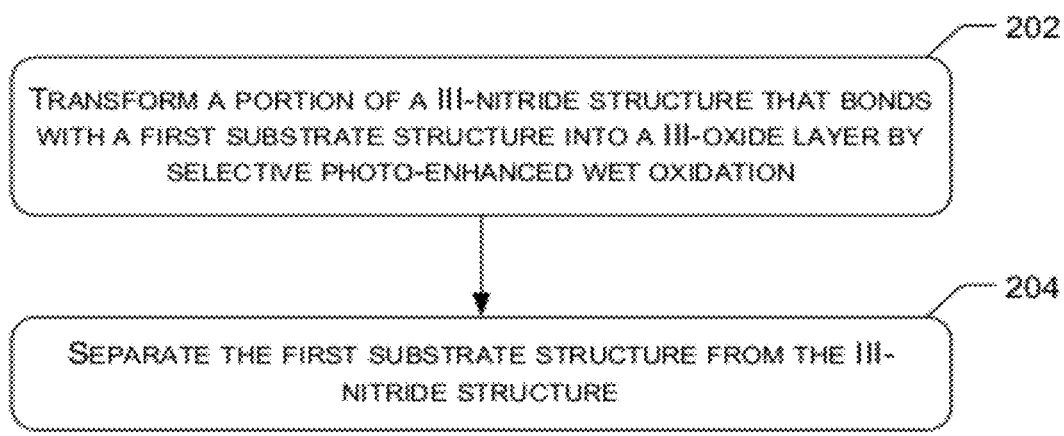
FIG. 2 is a flowchart diagram of a process of separating nitride films from a growth substrate in accordance with an embodiment to the present disclosure.

FIG. 2 illustrates a process 200 of separating nitride films from a growth substrate in accordance with an embodiment to the present disclosure.

At 202, the process 200 transforms a portion of a III-nitride structure that bonds with a first substrate structure into a III-oxide layer by selective photo-enhanced wet oxidation. For example, referring to FIGS. 1A-1B, the portion of the third III-nitride layer 150 of the III-nitride structure that bonds with the second III-nitride layer 130 of the first substrate structure is transformed into a III-oxide layer 190 by selective photo-enhanced wet oxidation. At 204, the process 200 separates the first substrate structure from the III-nitride structure.

In one embodiment, the first substrate structure may comprise a substrate and at least a first III-nitride layer having a first high bandgap energy on the substrate, and the III-nitride structure may comprise at least a second III-nitride layer having a first low bandgap energy that bonds with the first III-nitride layer.

The selective photo-enhanced wet oxidation may comprise photo-enhanced wet oxidation with a photonic energy between the first high bandgap energy and the first low bandgap energy.

The substrate may comprise a sapphire substrate, the first III-nitride layer may comprise a (In/Ga)N layer, the second III-nitride layer may comprise a (In/Ga)N layer, and the III-oxide layer may comprise a (In/Ga)2O3 layer.

In one embodiment, separating the first substrate structure from the III-nitride structure may comprise dissolving the III-oxide layer using an acidic electrolyte or a basic electrolyte. The acidic electrolyte may comprise $H_3PO_4$. The basic electrolyte may comprise KOH.

Additionally, the method may further comprise bonding a second substrate structure with a side of the III-nitride structure that does not bond with the first substrate structure prior to separating the first substrate structure from the III-nitride structure.

In one embodiment, a surface of the second substrate structure may comprise a metal bond layer, and bonding the second substrate structure with a side of the III-nitride structure that does not bond with the first substrate structure may comprise bonding the surface of the second substrate structure having the metal bond layer with the side of the III-nitride structure that does not bond with the first substrate structure.

Figure 3:
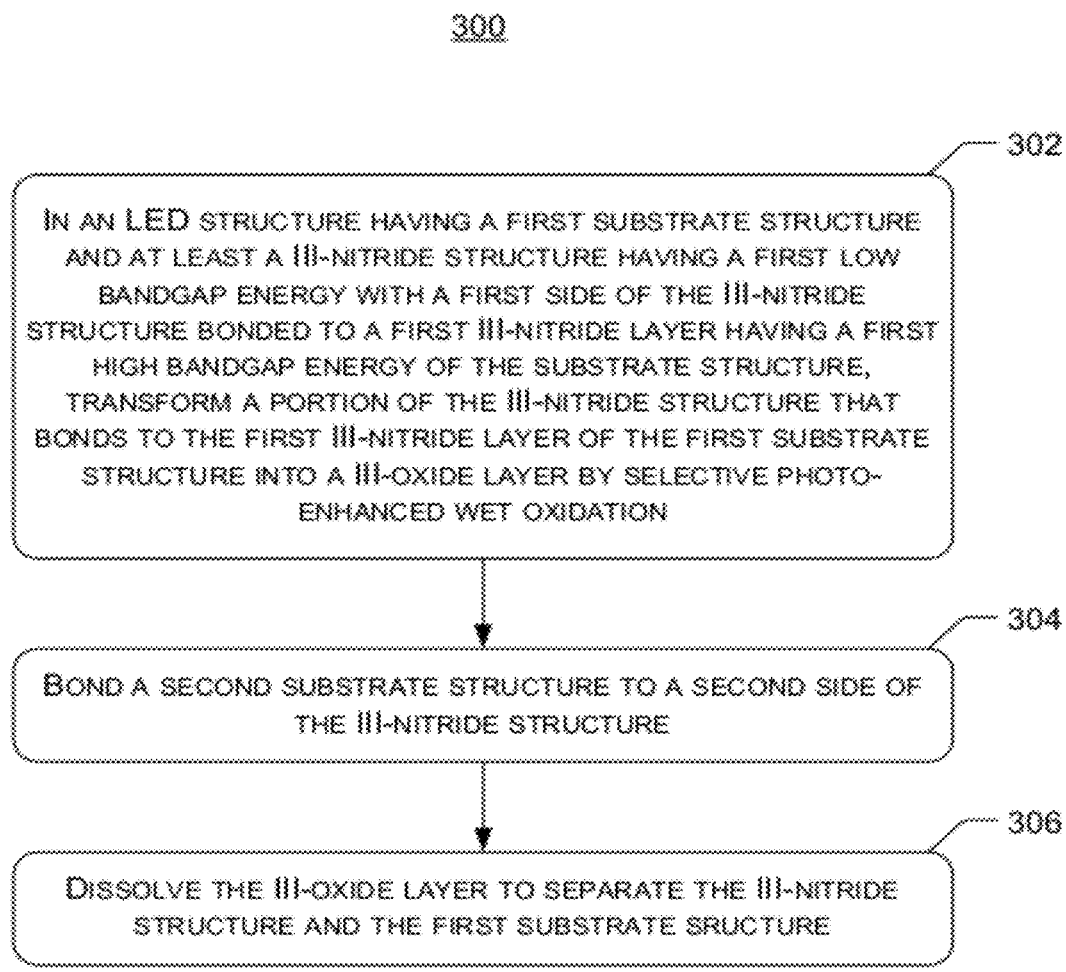
FIG. 3 is a flowchart diagram of a process of separating nitride films from a growth substrate in accordance with another embodiment to the present disclosure.

FIG. 3 illustrates a process 300 of separating nitride films from a growth substrate in accordance with another embodiment to the present disclosure.

The process 300 is applicable to an LED structure having a first substrate structure and at least a III-nitride structure having a first low bandgap energy. The first substrate structure includes a first III-nitride layer having a first high bandgap energy. A first side of the III-nitride structure is bonded to the first III-nitride layer of the substrate structure. In one embodiment, the first substrate structure also includes another III-nitride layer having a first low bandgap energy. For example, referring to FIG. 1A, the first substrate structure may include the substrate 110 having a III-nitride layer 120 with a low bandgap energy deposited thereon, and a second III-nitride layer 130 with a high bandgap energy deposited on the III-nitride layer 120.

At 302, the process 300 transforms a portion of the III-nitride structure that bonds to the first III-nitride layer of the first substrate structure into a III-oxide layer by selective photo-enhanced wet oxidation. At 304, the process 300 bonds a second substrate structure to a second side of the III-nitride structure. At 306, the process 300 dissolves the III-oxide layer to separate the III-nitride structure and the first substrate structure.

In one embodiment, the selective photo-enhanced wet oxidation may comprise photo-enhanced wet oxidation with a photonic energy between the first high bandgap energy and the first low bandgap energy.

The first substrate structure may comprise a sapphire substrate, the first III-nitride layer having a first high bandgap energy may comprise a (In/Ga)N layer, the first side of the III-nitride structure may comprise a (In/Ga)N layer, and the III-oxide layer may comprise a (In/Ga)2O3 layer.

In one embodiment, dissolving the III-oxide layer may comprise dissolving the III-oxide layer using an acidic electrolyte or a basic electrolyte. The acidic electrolyte may comprise $H_3PO_4$. The basic electrolyte may comprise KOH.

Conclusion

The above-described techniques pertain to techniques of separating nitride films from growth substrates by selective photo-enhanced wet oxidation.

Although the techniques have been described in language specific to structural features and/or methodological acts, it is to be understood that the appended claims are not necessarily limited to the specific features or acts described. Rather, the specific features and acts are disclosed as exemplary forms of implementing such techniques.

It is appreciated that the illustrated process 200 and process 300 are each one example of a suitable implementation of the proposed technique and is not intended to suggest any limitation as to the scope of use or functionality of the various embodiments described. Any variation of the disclosed embodiments made by a person of ordinary skill in the art shall be deemed to be within the spirit of the present disclosure, and thus shall be covered by the scope of the present disclosure.

What is claimed is:

1. A method comprising:
    forming a plurality of air gaps between a first substrate structure and a III-nitride structure that bonds with a first substrate structure;
    transforming a portion of the III-nitride structure including surfaces around the air gaps into a III-oxide layer by selective photo-enhanced wet oxidation, wherein the III-oxide layer is formed between an untransformed portion of the III-nitride structure and the first substrate structure; and
    dissolving the III-oxide layer to separate the first substrate structure from the III-nitride structure.

2. The method as recited in claim 1, wherein the first substrate structure comprises a substrate and at least a first III-nitride layer having a first high bandgap energy on the substrate, and wherein the III-nitride structure comprises at least a second III-nitride layer having a first low bandgap energy that bonds with the first III-nitride layer.

3. The method as recited in claim 2, wherein the selective photo-enhanced wet oxidation comprises photo-enhanced wet oxidation with a photonic energy between the first high bandgap energy and the first low bandgap energy.

4. The method as recited in claim 2, wherein the substrate comprises a sapphire substrate, wherein the first III-nitride layer comprises a (In/Ga)N layer, wherein the second III-nitride layer comprises a (In/Ga)N layer, and wherein the III-oxide layer comprises a $(In/Ga)_2O_3$ layer.

5. The method as recited in claim 1, wherein separating the first substrate structure from the III-nitride structure comprises dissolving the III-oxide layer using an acidic electrolyte or a basic electrolyte.

6. The method as recited in claim 5, wherein the acidic electrolyte comprises $H_3PO_4$, and wherein the basic electrolyte comprises KOH.

7. The method as recited in claim 1, further comprising:
    bonding a second substrate structure with a side of the III-nitride structure that does not bond with the first substrate structure prior to separating the first substrate structure from the III-nitride structure.

8. The method as recited in claim 7, wherein a surface of the second substrate structure comprises a metal bond layer, and wherein bonding the second substrate structure with a side of the III-nitride structure that does not bond with the first substrate structure comprises bonding the surface of the second substrate structure having the metal bond layer with the side of the III-nitride structure that does not bond with the first substrate structure.

9. A method comprising:
    forming a light-emitting diode (LED) structure having a first substrate structure and at least a III-nitride structure having a first low bandgap energy with a first side of the III-nitride structure bonded to a first III-nitride layer having a first high bandgap energy of the first substrate structure;
    forming a plurality of air gaps between the III-nitride structure and the first III-nitride layer;
    transforming a portion of the III-nitride structure including surfaces around the air gaps into a III-oxide layer by selective photo-enhanced wet oxidation, wherein the III-oxide layer is formed between an untransformed portion of the III-nitride structure and the first III-nitride layer;

bonding a second substrate structure to a second side of the III-nitride structure; and dissolving the III-oxide layer to separate the III-nitride structure and the first substrate structure.

10. The method as recited in claim 9, wherein the selective photo-enhanced wet oxidation comprises photo-enhanced wet oxidation with a photonic energy between the first high bandgap energy and the first low bandgap energy.

11. The method as recited in claim 10, wherein the first substrate structure comprises a sapphire substrate, wherein the first III-nitride layer having a first high bandgap energy comprises a (In/Ga)N layer, wherein the first side of the III-nitride structure comprises a (In/Ga)N layer, and wherein the III-oxide layer comprises a $(In/Ga)_2O_3$ layer.

12. The method as recited in claim 9, wherein dissolving the III-oxide layer comprises dissolving the III-oxide layer using an acidic electrolyte or a basic electrolyte.

13. The method as recited in claim 12, wherein the acidic electrolyte comprises $H_3PO_4$, and wherein the basic electrolyte comprises KOH.

* * * * *